United States Patent [19]
Fang et al.

[11] Patent Number: 5,935,868
[45] Date of Patent: Aug. 10, 1999

[54] INTERCONNECT STRUCTURE AND METHOD TO ACHIEVE UNLANDED VIAS FOR LOW DIELECTRIC CONSTANT MATERIALS

[75] Inventors: Sychyi Fang, Palo Alto; Chaunbin Pan, Santa Clara; Sing-Mo Tzeng, San Jose; Chien Chiang, Fremont, all of Calif.

[73] Assignee: Intel Corporation, Santa Clara, Calif.

[21] Appl. No.: 08/829,112

[22] Filed: Mar. 31, 1997

[51] Int. Cl.⁶ .................................................. H01L 21/00
[52] U.S. Cl. ........................ 438/692; 216/18; 216/38; 216/39; 257/774; 438/637; 438/672; 438/723; 438/737
[58] Field of Search .................... 216/18, 38, 39, 216/79; 438/637, 667, 672, 692, 697, 700, 720, 723, 724, 737, 738, 740, 742, 743, 744; 257/752, 758, 759, 774

[56] References Cited

U.S. PATENT DOCUMENTS

| | | | |
|---|---|---|---|
| 5,274,912 | 1/1994 | Olenick et al. | 216/18 X |
| 5,677,239 | 10/1997 | Isobe | 438/692 X |
| 5,741,626 | 4/1998 | Jain et al. | 216/18 X |
| 5,776,834 | 7/1998 | Avanzino et al. | 438/692 |

*Primary Examiner*—William Powell
*Attorney, Agent, or Firm*—Blakely, Sokoloff, Taylor & Zafman

[57] ABSTRACT

A method of forming an interconnect structure using a low dielectric constant material as an intralayer dielectric is described. In one embodiment, the present inventive method comprises the following steps. A conductive structure that is surrounded by a low dielectric constant material on its side surfaces is formed. A first inorganic insulator is formed over at least a portion of the low dielectric constant material. A second inorganic insulator is formed over the first inorganic insulator. A photoresist layer is deposited and then patterned to form an unlanded via in the second inorganic insulator. The second inorganic insulator and a portion of the first inorganic insulator are etched in order to form the unlanded via.

36 Claims, 10 Drawing Sheets

5,935,868

INTERCONNECT STRUCTURE AND METHOD TO ACHIEVE UNLANDED VIAS FOR LOW DIELECTRIC CONSTANT MATERIALS

BACKGROUND OF THE INVENTION

1. Field of the Invention

The present invention relates generally to semiconductor processing. More specifically, the present invention relates to a structure and method for forming an integrated circuit device having a multilayer interlayer dielectric structure.

2. Description of Related Art

During manufacturing of a semiconductor integrated circuit, electrically conductive materials patterned in electrical circuitry are layered over a base transistor structure that is disposed on a semiconductor substrate. The electrically conductive materials (e.g., copper) are in different and noncontiguous planes. Vias or pathways connect the various layers of electrically conductive materials. An insulator or dielectric material is placed between the separate planes of conductive material around the vias and also within the trenches in the circuit pattern of a layer of conductive material. Vias are usually formed as landed vias (i.e., the via rests entirely on a conductive layer) and not as unlanded vias (i.e., the via rests partially on a conductive layer and partially on an insulator). In addition, the typical insulator used is silicon dioxide, which has a dielectric constant (K) of about 4. Because better device performance can be achieved with lower capacitance between conductive lines within an insulating layer, the trend is to use insulators with a lower dielectric constant, such as an organic polymer.

FIGS. 1A–1D illustrate a related art method of forming landed vias. In FIG. 1A, a first conductive material 103 (e.g., aluminum) is deposited over silicon dioxide 101, which is disposed over a silicon substrate 100. An organic polymer 105 is surrounded on its side surfaces by conductive material 103 and silicon dioxide 107. The top surface of silicon dioxide 107 and organic polymer 105 are covered by a silicon nitride layer 109. In earlier steps (not shown), the silicon dioxide layer 107 and the conductive material 103 were etched to form an opening that was filled with polymer 105. In FIG. 1B, another layer of silicon dioxide 111 and a photoresist layer 113 are deposited over the structures shown in FIG. 1A.

In FIG. 1C, the photoresist layer is patterned to form a landed via 115. Silicon dioxide layer 111, nitride layer 109 and silicon dioxide layer 107 are etched to form two landed vias 115. Landed via 115 rests entirely over conductive material 103. The next step, as shown in FIG. 1D, is to remove photoresist layer 113. A second conductive material is formed in landed via 115 and then planarized to form conductive structure 117. The second conductive material can be tungsten or any other applicable metal. Thus, FIGS. 1A–1D illustrate a related art method of forming landed vias.

The industry trend is moving toward unlanded vias instead of landed vias because of the need for increased packing density. The semiconductor industry is also moving toward using organic polymers, which have a lower dielectric constant than silicon dioxide, in order to decrease the capacitance of the interconnection system. FIGS. 2A–2B illustrate how the related art method of FIGS. 1A–1D fails to produce a reliable unlanded via in the presence of an organic polymer. FIG. 2A illustrates a structure similar to FIG. 1C except that an unlanded via 216 is formed partially over conductive metal or layer 203 and partially over polymer 205. Photoresist layer 213 has been patterned and silicon dioxide layer 211, nitride layer 209 and polymer 205 have been etched during the formation of unlanded via 216.

In FIG. 2B, photoresist layer 213 is removed using oxygen ($O_2$) plasma. The polymer 205 is not protected from the oxygen plasma during the photoresist layer 213 strip and removal. As a result, a substantial amount of polymer 205 is eroded or destroyed by the oxygen plasma since polymer 205 is an organic material like the photoresist 213. Therefore, the oxygen plasma also etches the polymer 205 during the etch and removal of the photoresist layer 213. The result is an unlanded via 217 with an undesirable undercut. If polymer 205 is exposed to the oxygen plasma for a sufficiently long period, all of the polymer 205 will be removed. The overetch of the polymer 205 causes reliability problems and device failure. Thus, the related art method illustrated in FIGS. 1A–1D cannot be used to form an unlanded via in the presence of a low dielectric constant material, such as an organic polymer.

SUMMARY

A method for forming an interconnect structure is described. The method comprises the following steps. A conductive structure that is surrounded by a low dielectric constant material on its side surfaces is formed. A first inorganic insulator is formed over at least a portion of the low dielectric constant material. A second inorganic insulator is formed over the first inorganic insulator. A photoresist layer that is disposed over the second inorganic insulator is patterned. The second inorganic insulator and a portion of the first inorganic insulator are etched to form the unlanded via.

BRIEF DESCRIPTION OF THE DRAWINGS

The present invention is illustrated by way of example and not by limitation in the figures of the accompanying drawings in which like references indicate similar elements.

DETAILED DESCRIPTION

A method of forming an interconnect structure comprising an unlanded via and a low dielectric constant material as an intralayer dielectric are described. In the following description, numerous specific details are given to provide a thorough understanding of the invention. But it will be apparent to one skilled in the art that the invention may be practiced without these specific details. Moreover, in some instances, well-known semiconductor equipment and processes have not been set forth in detail in order not to unnecessarily hide the present invention.

The present invention is a method of forming an interconnect structure to achieve unlanded vias for low dielectric constant materials. In one embodiment, the present inventive method comprises the following steps. A conductive structure that is surrounded by a low dielectric constant material on its side surfaces is formed. A first inorganic insulator is formed over at least a portion of the low dielectric constant material. A second inorganic insulator is formed over the first inorganic insulator. A photoresist layer is deposited and then patterned to form an unlanded via in the second inorganic insulator. The second inorganic insulator and a portion of the first inorganic insulator are etched in order to form the unlanded via. Thus, a portion of the unlanded via can be disposed over the low dielectric constant material.

The present inventive method provides several advantages over the related art. First, the inventive method allows unlanded vias to be used in conjunction with a low dielectric constant material, such as an insulator containing organic materials. These organic materials can comprise a material that includes organic polymers such as PAE (polyarylether). The formation of unlanded vias allows greater packing density and thus meets the industry demand for greater chip density. Second, the present invention protects the low dielectric constant material during the photoresist strip process and during the via clean of the unlanded vias. Moreover, the use of a lower dielectric constant material as an interlayer dielectric film can improve interconnect performance in three areas: decreasing RC (resistance-capacitance) delay, decreasing cross-talk and decreasing power dissipation. Thus, the present inventive method improves the via reliability for unlanded vias.

Figure 1A:
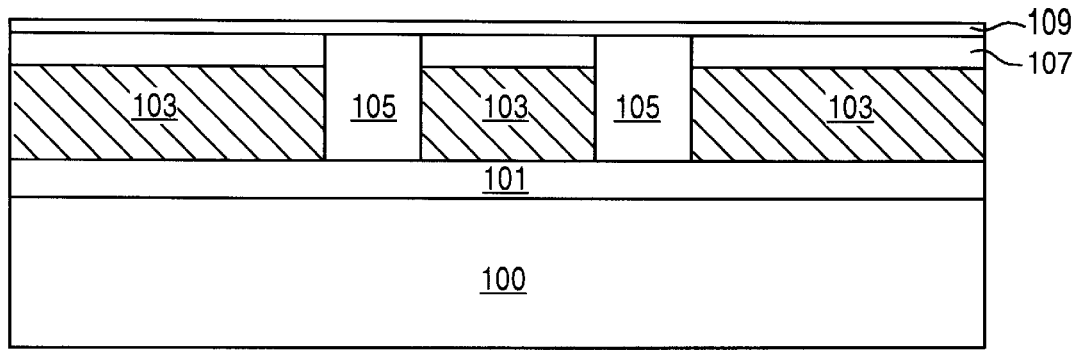
FIG. 1A illustrates a cross-section of the first step in a related art method of forming landed vias.
Figure 1B:
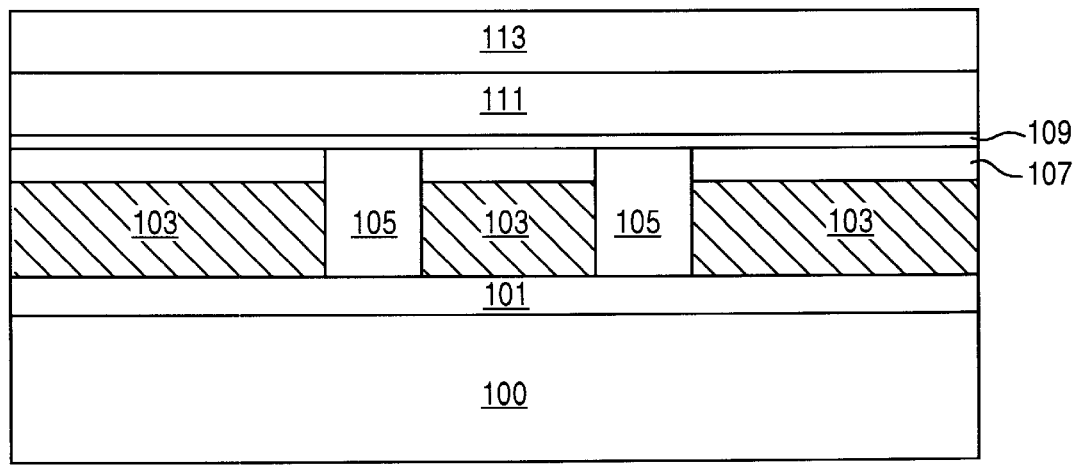
FIG. 1B is the next step of the related art method illustrated in FIG. 1A.
Figure 1C:
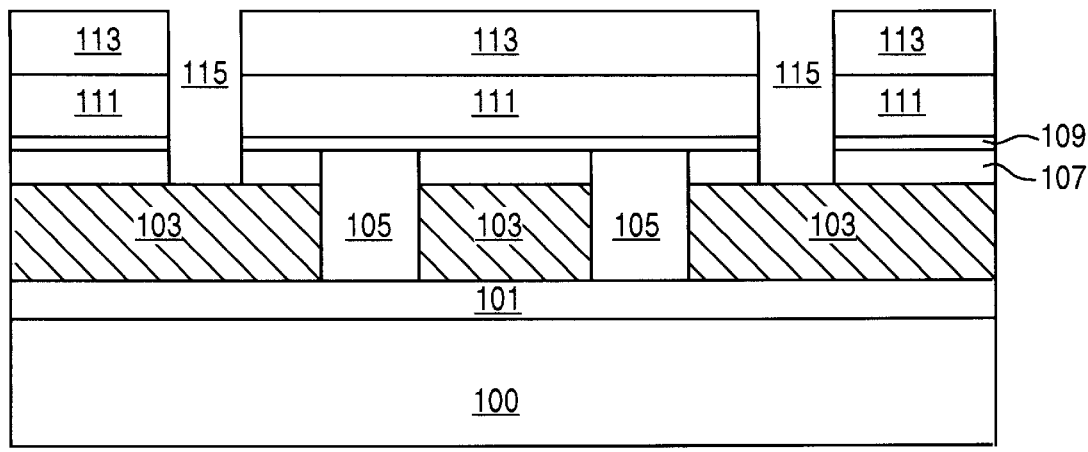
FIG. 1C illustrates a cross-section of the step following FIG. 1B of the related art method.
Figure 1D:
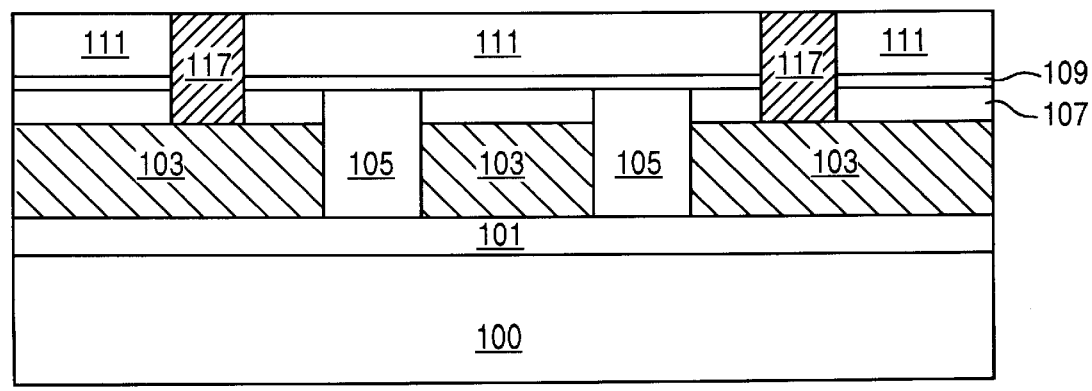
FIG. 1D illustrates a cross-section of the final step in the related art method.
Figure 2A:
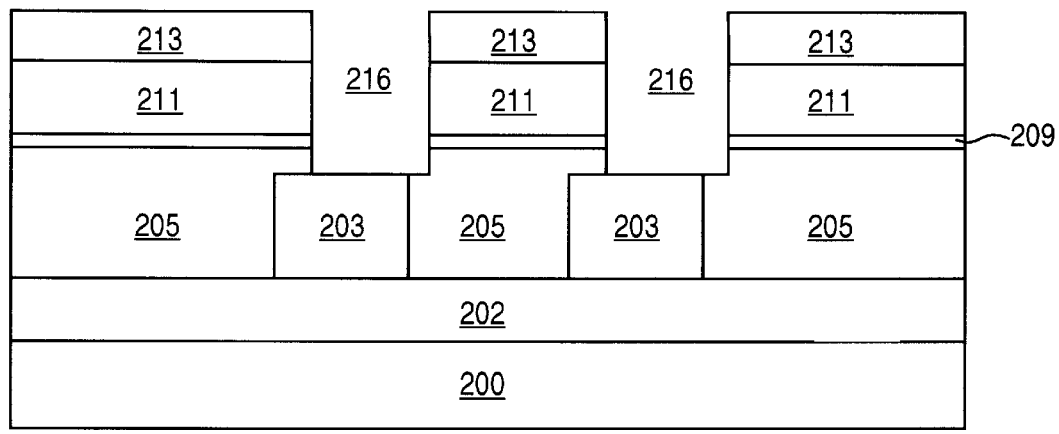
FIG. 2A illustrates a cross-section of how the related art method of FIGS. 1A–1D fail to produce an unlanded via.
Figure 2B:
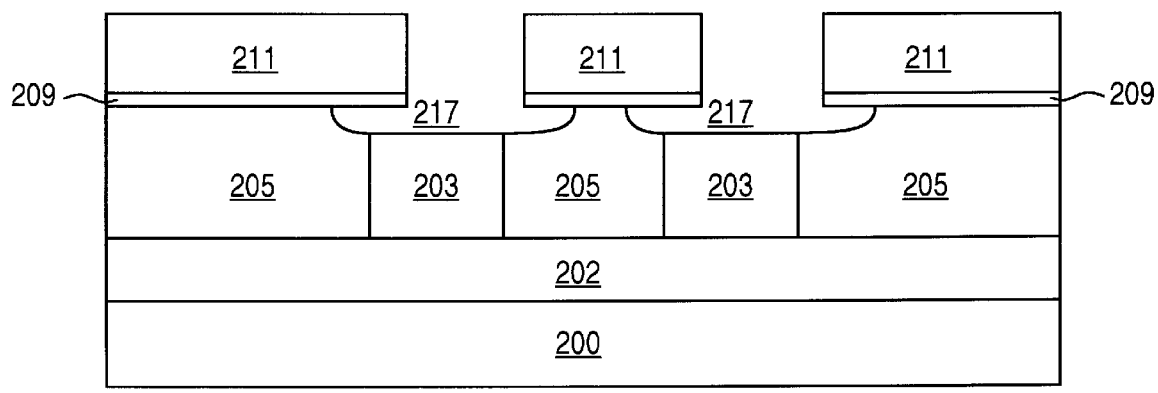
FIG. 2B is a cross-section of the next step following FIG. 2A.
Figure 3A:
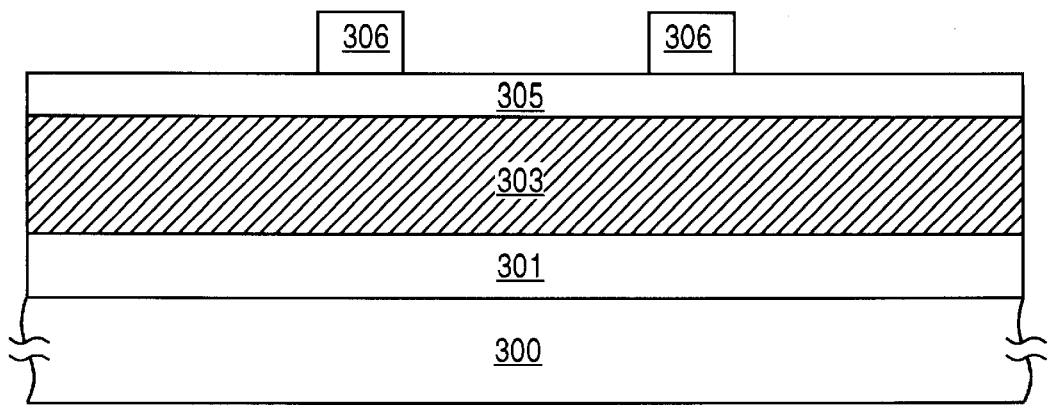
FIG. 3A illustrates a cross-section of the formation of a first conductive layer in one embodiment of the present invention.

FIGS. 3A–3I illustrate in cross-section the steps to form one embodiment of the present invention. Referring to FIG. 3A, a first insulating layer 301 is formed over a substrate 300. The substrate 300 typically contains active and passive semiconductor devices, at and within the substrate 300. The substrate 300 may also be one of the layers in a multilevel interconnect. First insulating layer 301 is used to isolate substrate 300 from a subsequently formed layer. In one embodiment, the first insulating layer 301 is silicon dioxide. It is to be appreciated that another dielectric may also be used to form first insulating layer 301. The first insulating layer 301 can be deposited using standard chemical vapor deposition (CVD) methods or other applicable techniques. A first conductive layer 303 is formed over first insulating layer 301. First conductive layer 303 comprises a material selected from the group consisting of aluminum, copper, tungsten, silver, gold, and their respective alloys. It is to be appreciated that other conductive materials can also be used to form first conductive layer 303. In addition, it will be appreciated that the circuit design determines the thickness of the first conductive layer 303.

A first inorganic insulator 305 is formed over the first conductive layer 303. The first inorganic insulator 305 comprises a material selected from the group consisting of an oxide, a nitride, an oxynitride and a combination of an oxide and a nitride or any other applicable insulator. For example, one of skill in the art will appreciate that first inorganic insulator can be silicon nitride. A first photoresist layer 306 is patterned over first inorganic insulator 305 to form two conductive structures or two conductive lines.

Figure 3B:
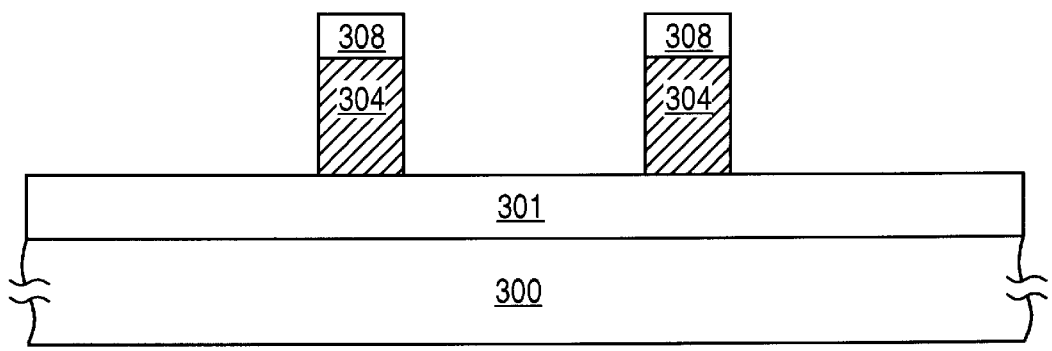
FIG. 3B illustrates a cross-section of an etch step and a photoresist strip following FIG. 3A.
Figure 3C:
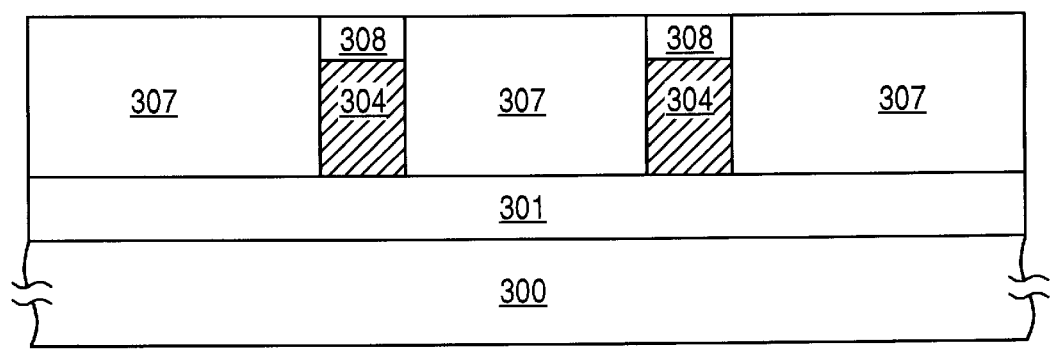
FIG. 3C illustrates a cross-section of the formation of a low dielectric constant material following the step shown in FIG. 3B.

Next, as shown in FIG. 3B, first inorganic insulator 305 and first conductive layer 303 are etched and first photoresist layer 306 is removed. Two conductive structures 304 with a cap of first inorganic insulator 308 are formed as illustrated in FIG. 3B. Next in FIG. 3C, a low dielectric constant material 307 (which includes e.g., an insulator containing organic material) is formed over the two conductive structures 304 and their respective inorganic insulator caps 308. If low dielectric constant material 307 is an organic polymer, then the polymer can be spun on or formed using standard techniques. The low dielectric constant material 307 is then planarized using conventional techniques, such as chemical-mechanical polishing. The planarization of low dielectric constant material 307 continues until the top surface of the low dielectric constant material 307 is substantially flush or planar with the top surface of first inorganic insulator cap 308.

Figure 3D:
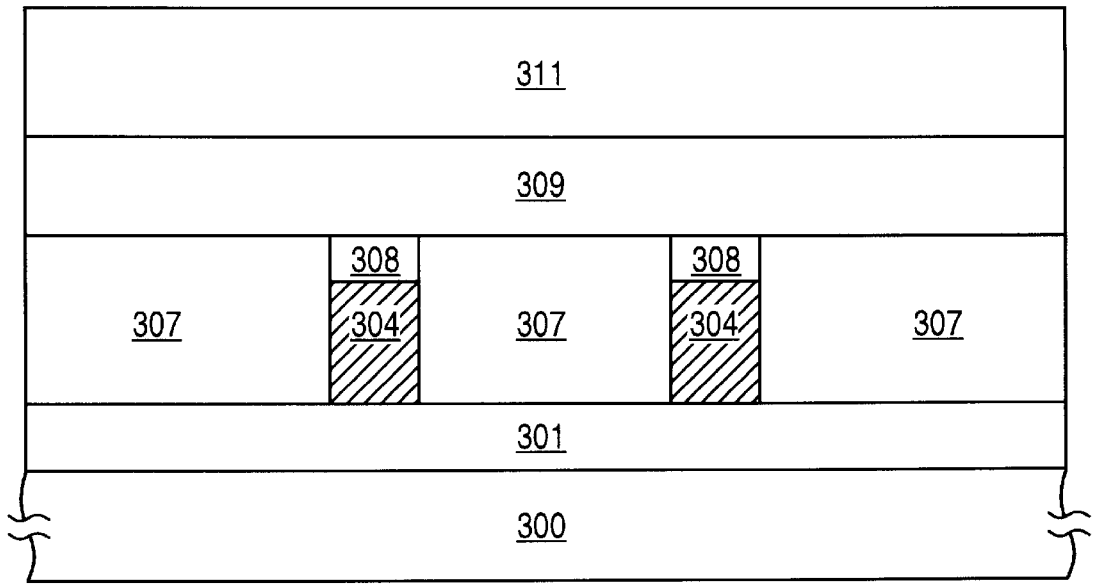
FIG. 3D illustrates a cross-section of the formation of a second inorganic insulator over the substrate shown in FIG. 3C.

In FIG. 3D, a second inorganic insulator 309 can be deposited or formed over low dielectric constant material 307 and first inorganic insulator 308. In one embodiment, second inorganic insulator 309 has a thickness of approximately 50 angstroms to approximately 3000 angstroms. In one embodiment, second inorganic insulator can be formed of a different material than first inorganic insulator 305. Second inorganic insulator 309 protects the low dielectric constant material 307 during the deposition of third inorganic insulator 311.

Third inorganic insulator 311 is then formed over second inorganic insulator 309. Third inorganic insulator 311 can be formed of a different material than second inorganic insulator 309 in order to allow a selective etch. In one embodiment, the thickness of third inorganic insulator 311 can be approximately 4000 angstroms to about 10,000 angstroms. The thickness of second inorganic insulator 309 and third inorganic insulator 311 change depending on the thickness of the underlying metal or conductive layer (e.g., first conductive layer 303). In one embodiment, the second inorganic insulator 309 and the third inorganic insulator 311 can comprise a material selected from the group consisting of an oxide, a nitride, an oxynitride and a combination of an oxide and a nitride and any other applicable dielectric. It is to be appreciated that other applicable dielectrics can also be used to form second inorganic insulator 309 and third inorganic insulator 311. In addition, second inorganic insulator 309 and third inorganic insulator 311 can be deposited using CVD or any other conventional technique, such as physical vapor deposition (PVD).

Figure 3E:
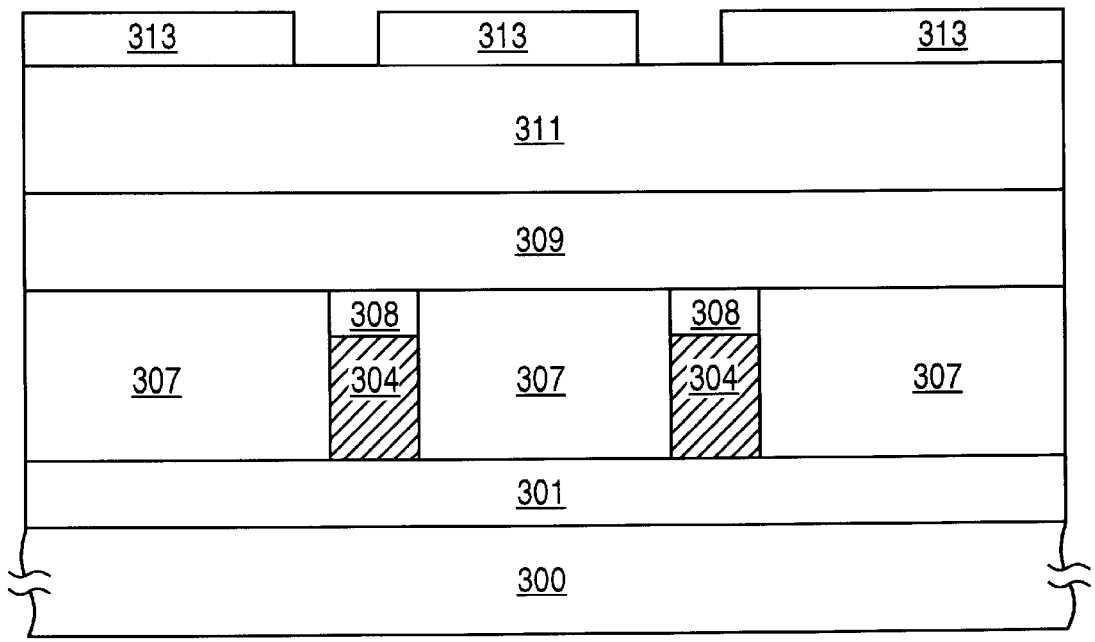
FIG. 3E illustrates a cross-section of the deposition and patterning of a second photoresist layer to form an unlanded via on the substrate of FIG. 3D.
Figure 3F:
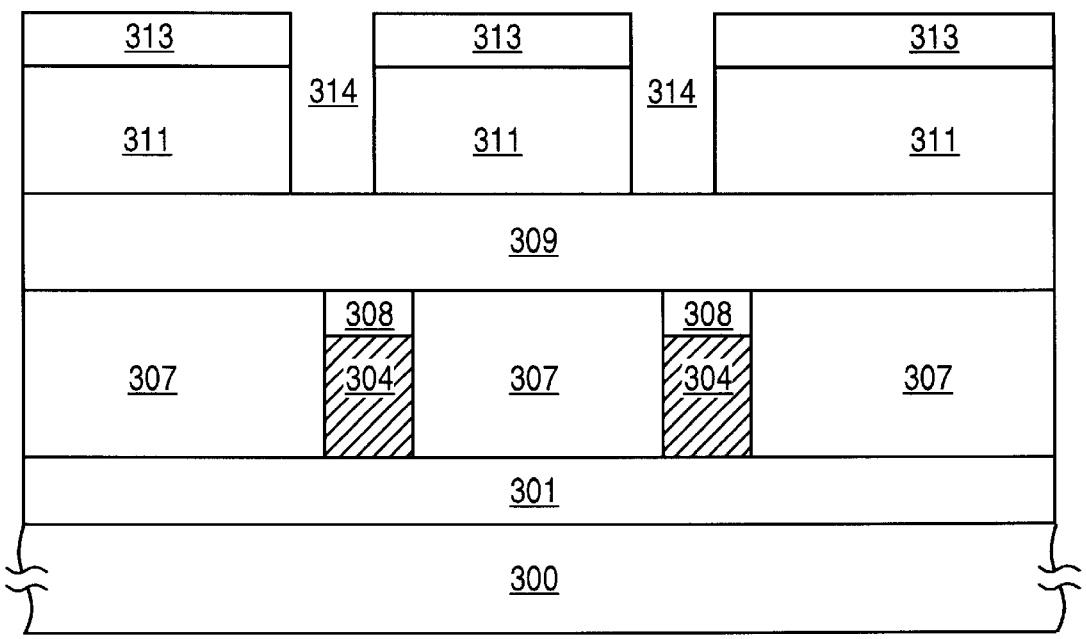
FIG. 3F is a cross-sectional view illustrating the use of standard etching techniques to etch a third inorganic insulator.
Figure 3G:
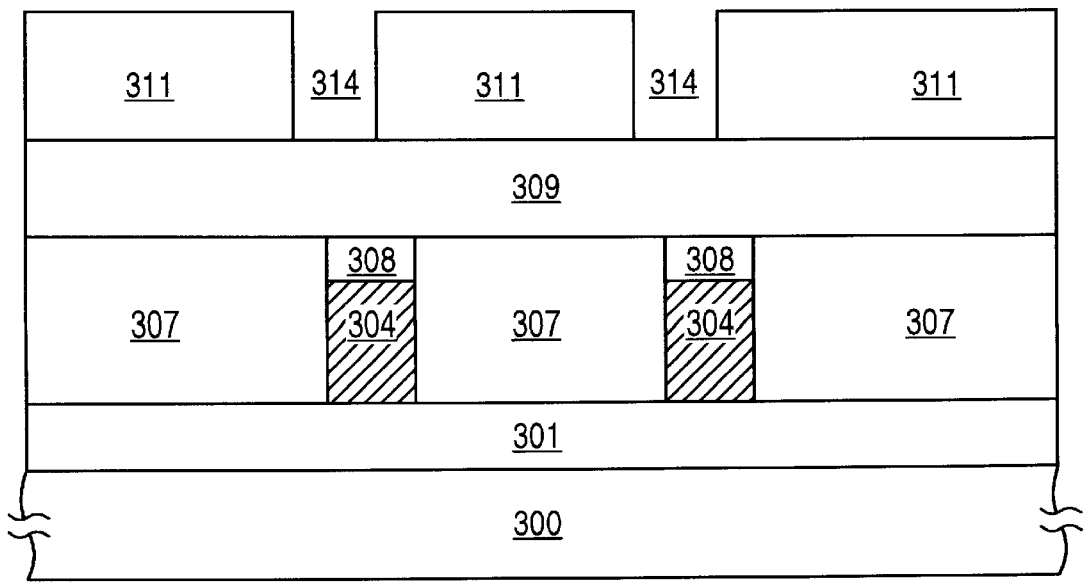
FIG. 3G illustrates a cross-section removing the photoresist shown in FIG. 3F.

Next, as shown in FIG. 3E, a second photoresist layer 313 can be deposited and patterned using well-known methods to form an unlanded via. In FIG. 3F, standard etch techniques can be used to etch third inorganic insulator 311. Second inorganic insulator 309 can serve as an etch stop layer during the etch of third inorganic insulator 311. It will be appreciated that second inorganic insulator 309 is a different material than third inorganic insulator 311. In addition, in the next step, which is shown in FIG. 3G, second photoresist layer 313 is removed using conventional photoresist strip methods, such as oxygen plasma ashing. Since low dielectric constant material 307 can be extremely vulnerable to oxygen ashing or photoresist strip/removal, second inorganic insulator 309 also protects the low dielectric constant material 307 during the photoresist strip.

Figure 3H:
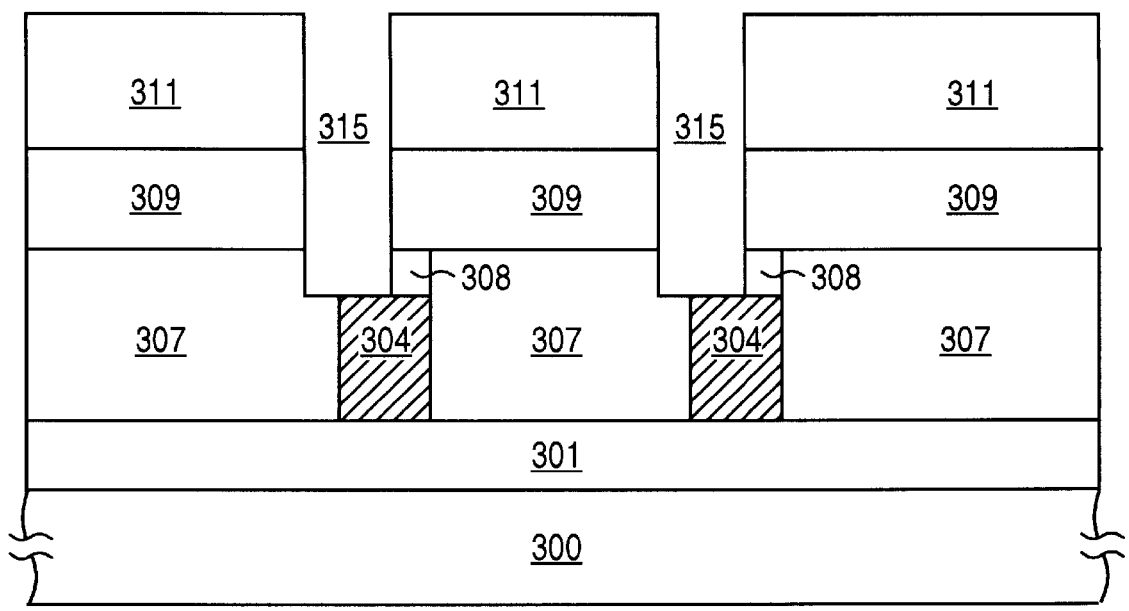
FIG. 3H illustrates a cross-section of the formation of an unlanded via according to one embodiment of the present invention.

Once the second photoresist layer 313 is removed, standard etch techniques are used to further form the unlanded via by etching through a portion of second inorganic insulator 309, through a portion of low dielectric constant material 307 and a portion of first insulating layer 308. The result is shown in FIG. 3H as a lower portion of the unlanded via 315 exposes a portion of low dielectric constant material 307, part of first conductive line or structure 304 and a part of first inorganic insulating cap 308. An unlanded via, such as 315 could not have been achieved under related art methods without the undesirable removal of low dielectric constant material 307 resulting in device failure and reliability problems.

Figure 3I:
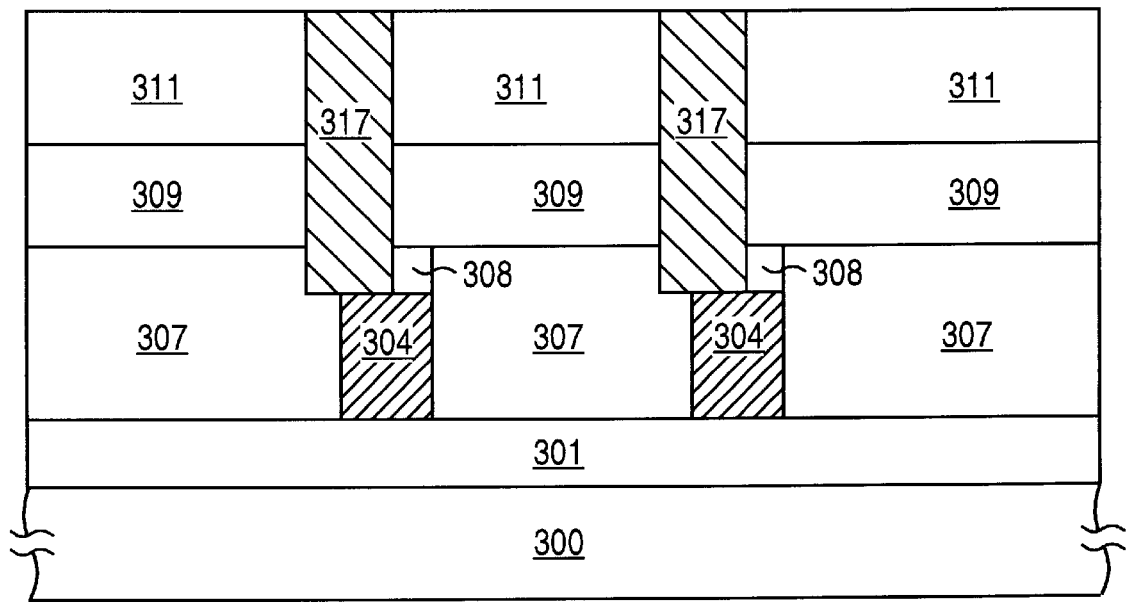
FIG. 3I illustrates a cross-section of the unlanded via of FIG. 3H after it has been cleaned and then filled with a conductive material.

In FIG. 3I, the unlanded via 315 can be cleaned and then filled with a second conductive layer 317 to form, for example, a plug. The unlanded via 315 is cleaned to remove any undesirable contaminants. Second conductive layer 317 can be formed during a metallization step using CVD, sputter deposition and metal reflow or any other applicable method. Moreover, second conductive layer 317 comprises a material selected from the group consisting of aluminum, copper, tungsten, silver, gold, copper and their respective alloys. It is to be appreciated that other conductive materials or metals can also be used to fill unlanded via 315. The entire process can be repeated beginning at FIG. 3A to form another unlanded via as part of an interconnect structure that includes a low dielectric constant material as an intralayer dielectric.

Figure 4A:
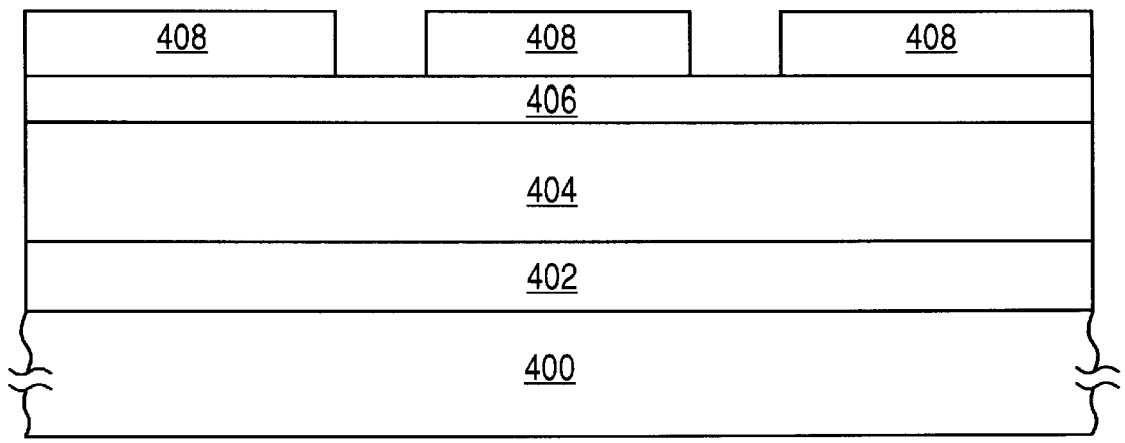
FIG. 4A illustrates a cross-sectional view of another embodiment of the present invention.

FIGS. 4A–4G are a cross-sectional view of another embodiment of the present invention that forms a damascene interconnect structure. Referring to FIG. 4A, a first insulating layer 402 (e.g., silicon dioxide) can be formed over substrate 400. Substrate 400 typically contains active and passive semiconductor devices, at and within the substrate 400. The substrate 400 can also be one of the layers in a multi-level interconnect. First insulating layer 402 is used to isolate substrate 400 from a subsequently formed layer. First insulating layer 402 can be deposited using standard chemical vapor deposition methods or other applicable techniques. A low dielectric constant material 404, which includes an insulator containing organic material, can be formed using conventional techniques over first insulating layer 402.

A first inorganic insulator 406 is formed using well-known methods over low dielectric constant material 404. In one embodiment, first inorganic insulator 406 can have a thickness in the range of approximately 50 Angstroms (Å) to about 3000 Å. First inorganic insulator 406 comprises a material selected from a group consisting of an oxide, a nitride, an oxynitride and an oxide/nitride combination. For example, first inorganic insulator 406 can be silicon dioxide. It will be appreciated that other inorganic insulators may also be used to form first inorganic insulator 406. A first photoresist layer 408 can be formed and patterned over first inorganic insulator layer 406. First photoresist layer 408 is patterned to form a trench or an opening for a subsequently formed metal line or conductive structure.

Figure 4B:
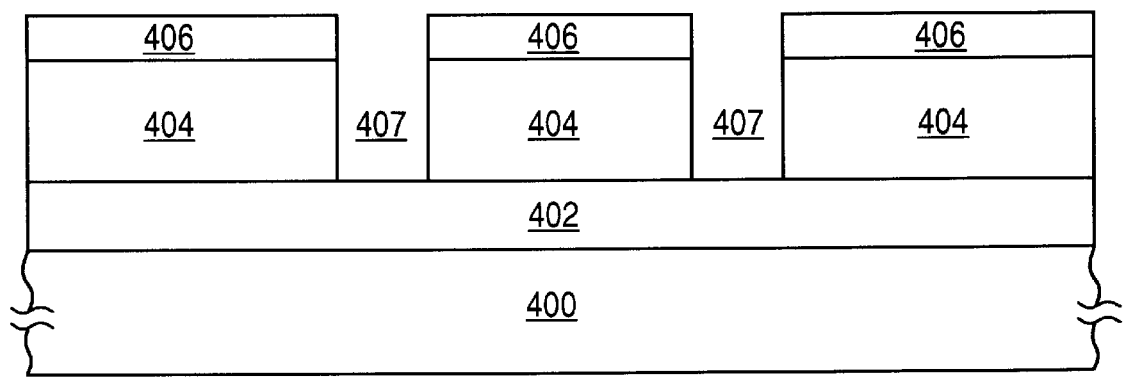
FIG. 4B illustrates the step following FIG. 4A.
Figure 4C:
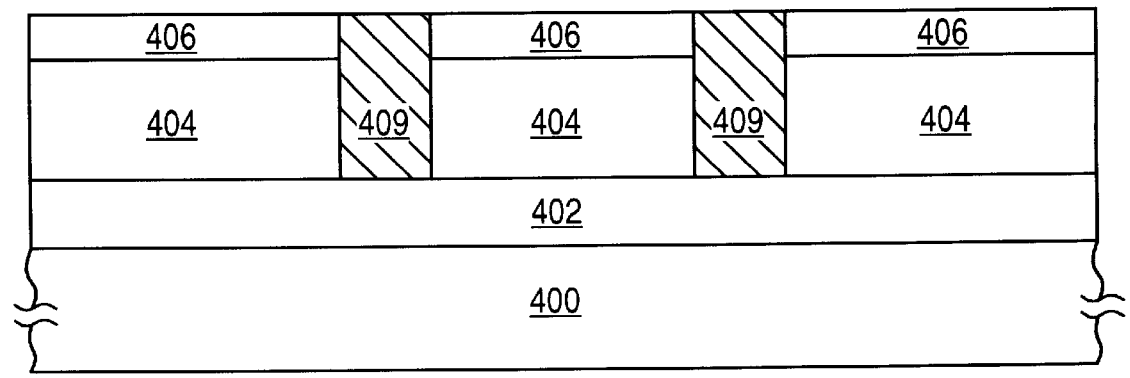
FIG. 4C is a cross-sectional view of FIG. 4B after the opening has been filled to the first conductive layer.

In FIG. 4B, first inorganic insulator 406 and low dielectric constant material 404 are etched to form two trenches or openings 407. This is accomplished using an appropriate etch recipe and etcher. In addition, first photoresist layer 408 is removed. Next, in FIG. 4C, trench or opening 407 can then be filled with first conductive layer 409. First conductive layer 409 can be conformally deposited according to well-known methods and then planarized using conventional techniques, such as chemical-mechanical polishing. First conductive layer 409 comprises a material selected from the group consisting of aluminum, copper, tungsten, silver, gold, copper and their respective alloys. It will be appreciated that other metals or conductive materials can also be used to form first conductive layer 409. In one embodiment, first conductive layer 409 can be planarized until a top surface of first conductive layer 409 is substantially flush or planar with a top surface of first inorganic insulator 406 as shown in FIG. 4C.

Figure 4D:
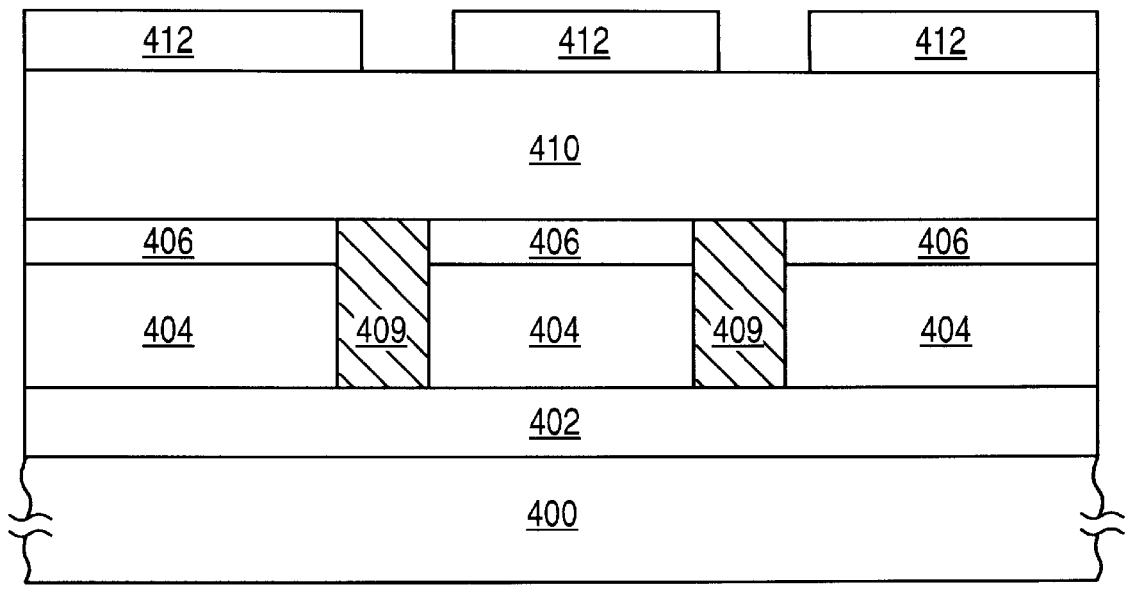
FIG. 4D is a cross-section illustrating a second inorganic insulator formed over the first conductive layer and over first inorganic insulator (both shown in FIG. 4C).

Next, as shown in FIG. 4D, a second inorganic insulator 410 can be formed over first conductive layer 409 and over first inorganic insulator 406. In one embodiment, second inorganic insulator 410 is a different material than first inorganic insulator 406. A second photoresist layer 412 is formed and patterned to form an unlanded via over second inorganic insulator 410. Second inorganic insulator 410, in one embodiment, can have a thickness in the range of about 4000 Å (Angstroms) to about 10,000 Å. In one embodiment, second inorganic insulator 410 comprises a material selected from the group consisting of an oxide, a nitride, an oxynitride and an oxide/nitride combination. For example, second inorganic insulator 410 can be silicon nitride. It is to be appreciated that other inorganic insulators can also be used to form second inorganic insulator 410.

Figure 4E:
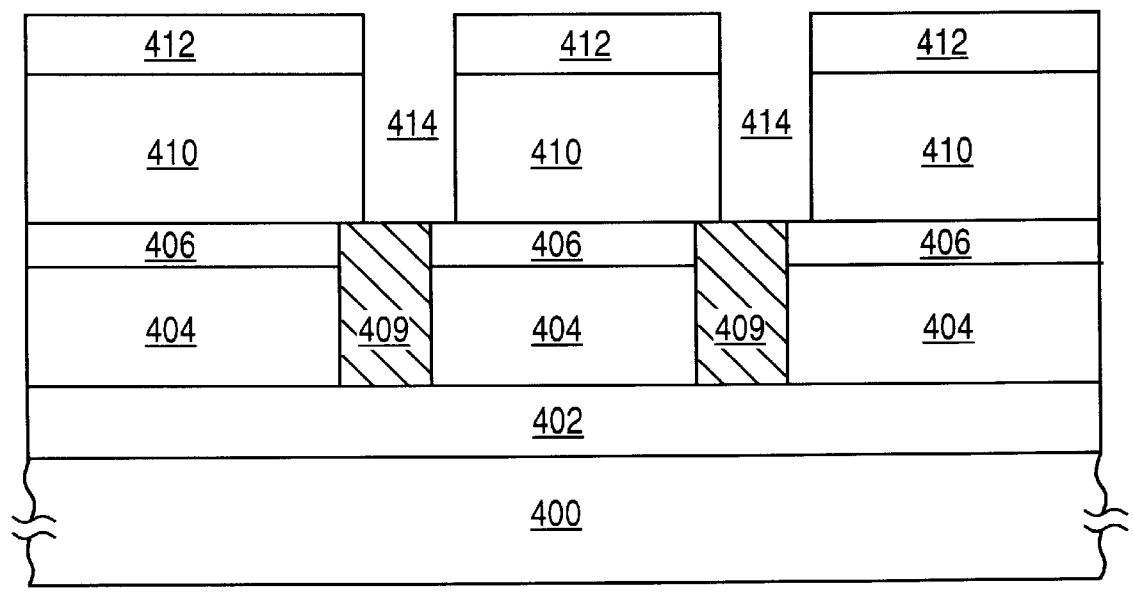
FIG. 4E is a cross-section illustrating a selective etch of second inorganic insulator shown in FIG. 4D.

Referring to FIG. 4E, conventional etch techniques are used to etch second inorganic insulator 410 and to form opening 414. A selective etch is achieved when second inorganic insulator 410 is etched but first inorganic insulator 406 and first conductive layer 409 are not etched.

Figure 4F:
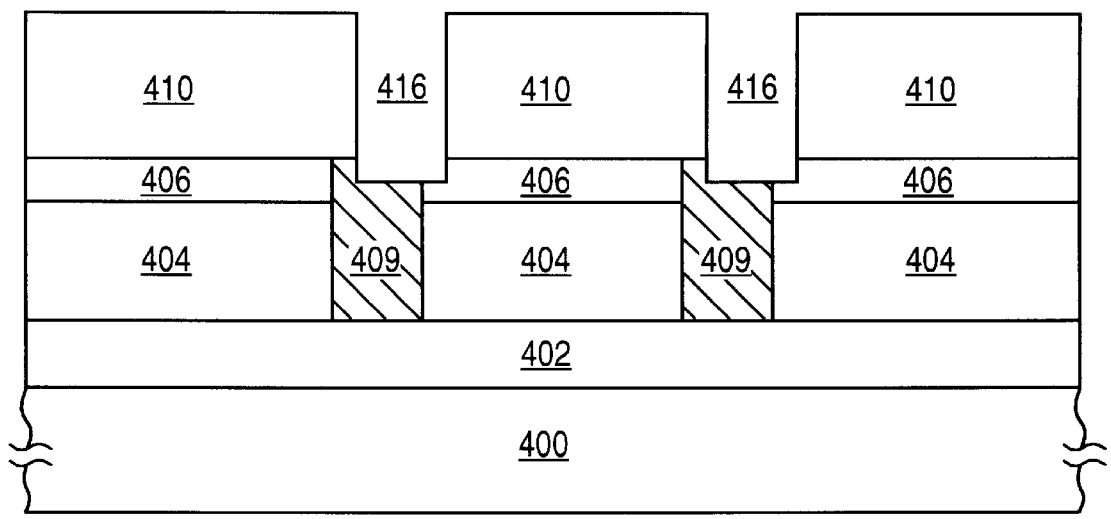
FIG. 4F is a cross-section illustrating an overetch of the etch shown in FIG. 4E.

FIG. 4F illustrates an overetch of the etch step of FIG. 4E. As illustrated in FIG. 4F, second photoresist layer 412 can be removed using conventional removal techniques, such as oxygen ($O_2$) plasma. It will be appreciated that second photoresist layer can also be removed during the etch of opening 414 in FIG. 4E. Low dielectric constant material 404 is protected, in one embodiment, from the oxygen plasma by first inorganic insulator 406. During the etch of second inorganic insulator 410 to form opening 414, an overetch can occur such that part of first conductive layer 409 and part of first inorganic layer 406 are also removed resulting in unlanded via 416. It will be appreciated that the steps shown in FIGS. 4E and 4F can be combined in a single step.

Figure 4G:
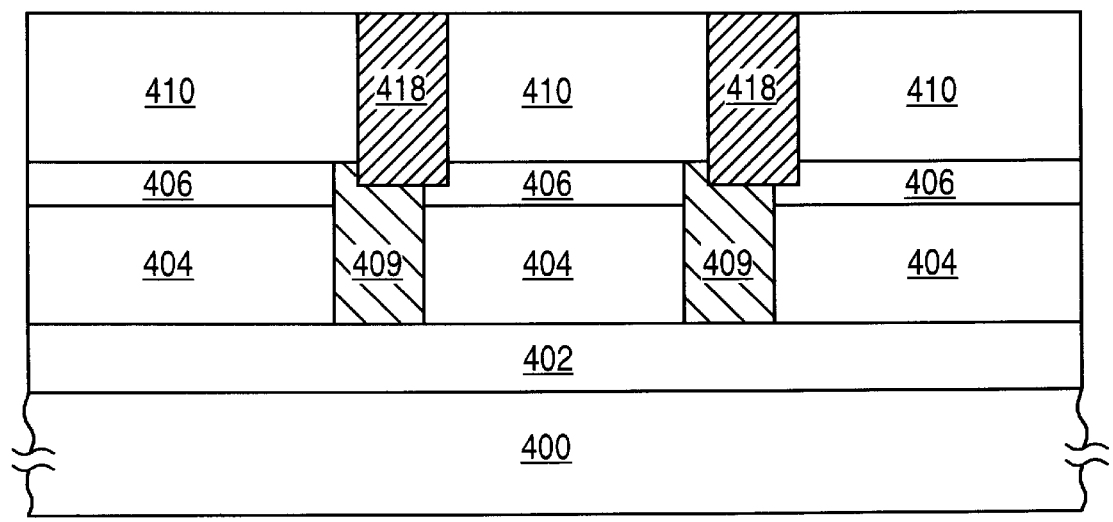
FIG. 4G illustrates in cross-section the cleaning and filling of the unlanded via of FIG. 4F with a second conductive layer.

Unlanded via 416 can be cleaned according to conventional methods and then filled with a second conductive layer 418 to form, for example, a plug as shown in FIG. 4G. The second conductive layer 418 may be formed during a metallization step using CVD metallization, sputter deposition and metal reflow or any other applicable method. After metallization, a planarization step, such as CMP, is used to remove any overflow or excess metal. Second conductive layer 418 can comprise a material selected from the group consisting of aluminum, copper, tungsten, silver, gold, copper and their respective alloys. It is to be appreciated that other metals can also be used to form second conductive layer 418. In a preferred embodiment, first conductive layer 409 is aluminum and second conductive layer 418 is tungsten. The process as illustrated from FIG. 4A through FIG. 4G can be repeated to form consecutive layers of interconnect structures over the one shown in FIG. 4G.

In the above description, numerous specific details are given to be illustrative and not limiting of the present invention. It will be evident to one skilled in the art that the invention may be practiced without these specific details. Moreover, in some instances, well-known semiconductor equipment and processes have not been set forth in detail in order to not unnecessarily obscure the present invention. Thus, the method of the present invention is defined by the appended claims.

We claim:

1. A method for forming an interconnect structure, comprising:
   forming a conductive structure that is surrounded by a low dielectric constant material on its side surfaces;
   forming a first inorganic insulator over at least a portion of said low dielectric constant material;
   forming a second inorganic insulator over said first inorganic insulator;
   patterning a photoresist layer that is disposed over said second inorganic insulator; and
   etching said second inorganic insulator and a portion of said first inorganic insulator to form an unlanded via.

2. The method of claim 1, further including the steps of:
   removing said photoresist layer, wherein said low dielectric constant material is protected by said first inorganic insulator; and
   causing a portion of said conductive structure and a portion of said low dielectric constant material to be exposed.

3. The method of claim 2, wherein said step of removing said photoresist layer includes using oxygen plasma and wherein said low dielectric constant material is an insulator containing organic material.

4. A method of forming an interconnect structure, comprising:
   forming a first conductive layer over a substrate;
   forming a first inorganic insulator over said first conductive layer;
   etching said first inorganic insulator to form a first inorganic insulator cap;
   etching said first conductive layer to form a first conductive structure, wherein said first inorganic insulator cap covers a top surface of said first conductive structure;
   forming a low dielectric constant material over said first conductive structure and said first inorganic insulator cap;
   planarizing said low dielectric constant material until a top surface of said low dielectric constant material is substantially flush with a top surface of said first inorganic insulator cap, wherein said low dielectric constant material surrounds said first conductive structure;
   forming a second inorganic insulator over said low dielectric constant material and said first inorganic insulator cap;
   forming a third inorganic insulator over said second inorganic insulator;
   patterning a photoresist layer disposed over said third inorganic insulator;
   etching said third inorganic insulator, wherein said second inorganic insulator acts as an etch stop layer;
   removing said photoresist layer; and
   etching said second inorganic insulator and said first inorganic insulator cap to form an unlanded via so that a portion of said second inorganic insulator, part of said first inorganic insulator cap, part of said low dielectric constant material and part of said first conductive layer are exposed.

5. The method of claim 4, further comprising:
   cleaning said unlanded via; and
   forming a second conductive layer in said unlanded via.

6. The method of claim 4, wherein said first, said second and said third inorganic insulators each comprise a material selected from the group consisting of an oxide, a nitride, an oxynitride and a combination of an oxide and a nitride, and wherein said third inorganic insulator is different from said second inorganic insulator.

7. The method of claim 4, wherein said second inorganic insulator has a thickness in the range of about 50 Angstroms (Å) to about 3000 Angstroms.

8. The method of claim 4, wherein said third inorganic insulator has a thickness of approximately 4000 Å to approximately 10,000 Å.

9. The method of claim 4, wherein oxygen plasma is used during said step of removing said photoresist layer, and wherein said low dielectric constant material is protected from said oxygen plasma by said second inorganic insulator.

10. The method of claim 9, wherein said second inorganic insulator is different from said third inorganic insulator.

11. The method of claim 4, wherein said first inorganic insulator comprises a material selected from the group consisting of an oxide, a nitride, an oxynitride and a combination of an oxide and a nitride.

12. The method of claim 4, wherein said first conductive layer comprises a material selected from the group consisting of aluminum, copper, tungsten, silver, gold, copper and their respective alloys.

13. The method of claim 4, wherein said second conductive layer comprises a material selected from the group consisting of tungsten, aluminum, copper, silver, gold, copper and their respective alloys.

14. The method of claim 4, wherein said first inorganic insulator is an oxide, said second inorganic insulator is a nitride and said third inorganic insulator is an oxide.

15. A method of forming an interconnect structure, comprising:
   forming a low dielectric constant material over a conductive structure having its top surface covered with a first inorganic insulator, wherein said conductive structure is formed of a first conductive material;
   removing said low dielectric constant material until said low dielectric constant material's top surface is substantially aligned with said first inorganic insulator's top surface, wherein said low dielectric constant material also contacts a side surface of said conductive structure;
   forming a second inorganic insulator over said low dielectric constant material and said first inorganic insulator;

forming a third inorganic insulator over said second inorganic insulator, wherein said third inorganic insulator is different from said second inorganic insulator; and etching said third inorganic insulator to form an unlanded via.

16. The method of claim 15, further comprising:

patterning a photoresist layer that is disposed over said third inorganic insulator to form said unlanded via; and removing said photoresist layer after said step of etching said third inorganic insulator.

17. The method of claim 16, further comprising the step of:

etching said second inorganic insulator and said first inorganic insulator so that a first part of said unlanded via contacts said second inorganic insulator, and a second part of said unlanded via contacts said first inorganic insulator, a portion of said low dielectric constant material and a portion of said conductive structure.

18. The method of claim 17, further comprising the steps of:

cleaning said unlanded via; and forming a second conductive material in said unlanded via.

19. An interconnect structure, comprising:

a conductive structure;

a low dielectric constant material surrounding a side surface of said conductive structure;

a first inorganic insulator disposed over a portion of said conductive structure, said first inorganic insulator having a first side surface that contacts said low dielectric constant material and a second side surface; and an unlanded via having a lower portion that exposes said second side surface of said first inorganic insulator at a first point, said lower portion also exposes said conductive structure at a second point and also exposes said low dielectric constant material at a third point, wherein said unlanded via is disposed above said conductive structure.

20. The interconnect structure of claim 19, wherein said unlanded via further includes a middle portion that exposes a second inorganic insulator, and a top portion that exposes a third inorganic insulator that can be selectively etched without etching through said second inorganic insulator, wherein said middle portion is disposed above said lower portion but is disposed below said top portion.

21. The interconnect structure of claim 19, wherein said first inorganic insulator comprises a material selected from the group consisting of an oxide, a nitride, an oxynitride and an oxide/nitride combination.

22. The interconnect structure of claim 20, wherein said second and third inorganic insulators comprise a material selected from the group consisting of an oxide, a nitride, an oxynitride and a oxide/nitride combination, wherein said second and third inorganic insulators are different materials.

23. A method of forming a damascene interconnect structure, comprising:

forming a low dielectric constant material over a substrate;

forming a first inorganic insulator over said low dielectric constant material;

patterning a first photoresist layer that is disposed above said first inorganic insulator in order to form an opening;

etching said first inorganic insulator;

etching said low dielectric constant material to form said opening;

removing said first photoresist layer;

forming a first conductive layer in said opening and over said first inorganic insulator;

planarizing said first conductive layer until its top surface is substantially planar with a top surface of said first inorganic insulator;

forming a second inorganic insulator over said first conductive layer and said first inorganic insulator;

patterning a second photoresist layer disposed over said second inorganic insulator to form an unlanded via;

etching said second inorganic insulator to form said unlanded via, wherein said first inorganic insulator acts as an etch-stop layer; and removing said second photoresist layer.

24. The method of claim 23, further comprising:

removing part of said first conductive layer and part of said first inorganic insulator so that a lower portion of said unlanded via exposes a portion of said first conductive layer and a portion of said first inorganic insulator.

25. The method of claim 23, further comprising the steps of:

cleaning said unlanded via; and forming a second conductive layer in said unlanded via, wherein said low dielectric constant material is not exposed to said unlanded via.

26. The method of claim 23, wherein said first and second inorganic insulators each comprise a material selected from the group consisting of an oxide, a nitride, an oxynitride and an oxide/nitride combination.

27. The method of claim 23, wherein said first conductive layer comprises a material selected from the group consisting of aluminum, copper, tungsten, silver, gold, copper and their respective alloys.

28. The method of claim 25, wherein said second conductive layer comprises a material selected from the group consisting of aluminum, copper, tungsten, silver, gold, copper and their respective alloys.

29. The method of claim 23, wherein an oxygen plasma is used to remove said second photoresist layer, and wherein said first inorganic insulator protects said low dielectric constant material from said oxygen plasma.

30. The method of claim 23, wherein said first inorganic insulator has a thickness in the range of approximately 50 Å to approximately 3000 Å.

31. The method of claim 23, wherein said second inorganic insulator has a thickness in the range of about 4000 Å to about 10,000 Å.

32. A method of forming a damascene interconnect structure, comprising:

forming a trench in a first inorganic insulator and in a low dielectric constant material that is disposed below said first inorganic insulator;

forming a first conductive layer in said trench;

forming a second inorganic insulator over said first conductive layer and said first inorganic insulator;

patterning a photoresist layer disposed over said second inorganic insulator; and etching said second inorganic insulator to form an unlanded via.

33. The method of claim 32, further comprising:

removing said photoresist layer; and removing part of said first conductive layer and part of said first inorganic insulator so that a portion of said unlanded via exposes a portion of said first conductive layer and a portion of said first inorganic insulator.

34. The method of claim 33, further including:

cleaning said unlanded via; and forming a second conductive layer in said unlanded via.

35. An interconnect structure, comprising:

a first conductive structure having a top surface, a side surface having an upper portion surrounded by a first inorganic insulator and a lower portion of said side surface surrounded by a low dielectric constant material; and an unlanded via disposed over part of said top surface of said first conductive structure and over part of said first inorganic insulator; and a second inorganic insulator exposed by said unlanded via, wherein said second inorganic insulator is disposed over said first inorganic insulator.

36. The interconnect structure of claim 35, further comprising:

a second conductive layer formed in said unlanded via.

* * * * *

UNITED STATES PATENT AND TRADEMARK OFFICE
CERTIFICATE OF CORRECTION

PATENT NO.    : 5,935,868
DATED         : August 10, 1999
INVENTOR(S)   : Fang et al.

It is certified that error appears in the above-identified patent and that said Letters Patent is hereby corrected as shown below:

<u>Title page,</u>
Item [75], Delete "Chaunbin" and insert -- Chuanbin --.

Signed and Sealed this

Twenty-seventh Day of May, 2003

JAMES E. ROGAN
*Director of the United States Patent and Trademark Office*